(12) United States Patent
Chen

(10) Patent No.: US 9,001,561 B2
(45) Date of Patent: *Apr. 7, 2015

(54) PERFORMING FORMING PROCESSES ON RESISTIVE MEMORY

(71) Applicant: Micron Technology, Inc., Boise, ID (US)

(72) Inventor: Xiaonan Chen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/250,106

(22) Filed: Apr. 10, 2014

(65) Prior Publication Data

US 2014/0313814 A1    Oct. 23, 2014

Related U.S. Application Data

(63) Continuation of application No. 13/286,375, filed on Nov. 1, 2011, now Pat. No. 8,730,708.

(51) Int. Cl.
    *G11C 11/00*      (2006.01)
    *G11C 13/00*      (2006.01)

(52) U.S. Cl.
    CPC ........ *G11C 13/0069* (2013.01); *G11C 13/0002* (2013.01); *G11C 13/0004* (2013.01); *G11C 13/0007* (2013.01); *G11C 2013/0073* (2013.01); *G11C 2013/0083* (2013.01); *G11C 2013/0092* (2013.01)

(58) Field of Classification Search
    CPC ............... G11C 11/16; G11C 13/0069; G11C 13/0007; G11C 2013/0073; G11C 13/003; G11C 11/15; G11C 7/06; G11C 7/12; G11C 11/00; G11C 16/28; G11C 7/02
    USPC .......................... 365/148, 158, 163, 171–175
See application file for complete search history.

(56) References Cited

U.S. PATENT DOCUMENTS

| | | | |
|---|---|---|---|
| 6,930,909 B2 | 8/2005 | Moore et al. |
| 7,586,776 B2 | 9/2009 | Oh et al. |
| 7,639,522 B2 | 12/2009 | Cho et al. |
| 7,778,066 B2 | 8/2010 | Horii et al. |
| 7,778,079 B2 | 8/2010 | Jeong et al. |
| 7,796,424 B2 | 9/2010 | Happ et al. |
| 7,800,935 B2 | 9/2010 | Maejima et al. |

(Continued)

OTHER PUBLICATIONS

Aratani, K. et al. "A Novel Resistance Memory with High Scalability and Nanosecond Switching", IEEE International Electron Devices Meeting 2007, pp. 783-786, Dec. 10-12, 2007.

(Continued)

*Primary Examiner* — Hien Nguyen
(74) *Attorney, Agent, or Firm* — Brooks, Cameron & Huebsch, PLLC

(57) ABSTRACT

The present disclosure includes apparatuses and methods for performing forming processes on resistive memory. A number of embodiments include applying a formation signal to the storage element of a resistive memory cell, wherein the formation signal includes a first portion having a first polarity and a first amplitude, a second portion having a second polarity and a second amplitude, wherein the second polarity is opposite the first polarity and the second amplitude is smaller than the first amplitude, and a third portion having the first polarity and a third amplitude that is smaller than the first amplitude.

27 Claims, 5 Drawing Sheets

(56) References Cited

U.S. PATENT DOCUMENTS

| | | | |
|---|---|---|---|
| 7,826,248 B2 | 11/2010 | Xi et al. | |
| 7,835,173 B2 | 11/2010 | Ma et al. | |
| 7,885,121 B2 | 2/2011 | Takase | |
| 7,960,224 B2 | 6/2011 | Chien et al. | |
| 8,730,708 B2 * | 5/2014 | Chen | 365/148 |
| 2008/0080226 A1 | 4/2008 | Mikolajick et al. | |
| 2009/0279343 A1 | 11/2009 | Chang et al. | |
| 2010/0067281 A1 | 3/2010 | Xi et al. | |
| 2010/0103717 A1 | 4/2010 | Lee et al. | |
| 2010/0232209 A1 | 9/2010 | Kawabata et al. | |
| 2010/0237317 A1 | 9/2010 | Tsunoda | |
| 2010/0284212 A1 | 11/2010 | Bedeschi et al. | |
| 2011/0007551 A1 | 1/2011 | Tian et al. | |
| 2011/0069539 A1 | 3/2011 | Eleftheriou et al. | |

OTHER PUBLICATIONS

Chen, Y.S. et al. "Highly Scalable Hafnium Oxide Memory with Improvements of Resistive Distribution and Read Disturb Immunity", IEEE International Electron Devices Meeting 2009, pp. 5.5.1-5.5.4, Dec. 7-9, 2009.

Chen, Yu-Sheng et al. "Forming-free HfO2 Bipolar RRAM Device with Improved Endurance and High Speed Operation", VLSI Technology, Systems, and Applications 2009, pp. 37-38, Apr. 27-29, 2009.

Choi, Hyejung et al. "An electrically modifiable synapse array of resistive switching memory", Nanotechnology, vol. 20, 345201, 5 pp., Aug. 4, 2009.

Choi, Sang-Jun et al. "Multibit Operation of Cu/Cu—GeTe/W Resistive Memory Device Controlled by Pulse Voltage Magnitude and Width", IEEE Electron Device Letters, vol. 32, No. 3, pp. 375-377, Mar. 2011.

Gao, Bin et al. "Modeling of Retention Failure Behavior in Bipolar Oxide-Based Resistive Switching Memory", IEEE Electron Device Letters, vol. 32, No. 3, pp. 276-278, Mar. 2011.

Fang, Z. et al. "Temperature Instability of Resistive Switching on HfOx-based RRAM Devices", IEEE Electron Device Letters, vol. 31, No. 5, pp. 476-478, May 2010.

Kund, Michael et al. "Conductive bridging RAM (CBRAM): An emerging non-volatile memory technology scalable to sub 20nm", IEEE International Electron Devices Meeting 2005, pp. 754-757, Dec. 5, 2005.

Lee, H.Y. et al. "Low Power and High Speed Bipolar Switching with a Thin Reactive Ti Buffer Layer in Robust HfO2 Based RRAM", IEEE International Electron Devices Meeting 2008, pp. 1-4, Dec. 15-17, 2008.

Liaw, Corvin et al. "The Conductive Bridging Random Access Memory (CBRAM): A Non-Volatile Multi-Level Memory Technology", ESSDERC Solid State Device Research Conference 2007, pp. 226-229, Sep. 11-13, 2007.

Liu, Chih-Yi et al. "Resistance switching properties of sol-gel derived SrZrO3 based memory thin films", Journal of Physics D: Applied Physics, vol. 40, pp. 2157-2161, Mar. 16, 2007.

Rahaman, S.Z. et al. "Low Current and Voltage Resistive Switching Memory Device Using Novel Cu/Ta2O5/W Structure", VLSI Technology, Systems, and Applications 2009, pp. 33-34, Apr. 27-29, 2009.

Soni, R. et al. "Reliability analysis of the low resistance state stability of Ge0.3Se0.7 based solid electrolyte nonvolatile memory cells", Applied Physics Letters, vol. 94, 123503, 3 pp., Mar. 26, 2009.

Waser, R. et al. "Redox-Based Resistive Switching Memories-Nanoionic Mechanisms, Prospects, and Challenges", Advanced Materials, vol. 21, No. 25-26, pp. 2632-2663, Jul. 13, 2009.

Yu, Shimeng et al. "Investigating the switching dynamics and multilevel capability of bipolar metal oxide resistive switching memory", Applied Physics Letters, vol. 98, 103514, 3 pp., Mar. 11, 2011.

Zhang, Wangyuan et al. "Helmet: A Resistance Drift Resilient Architecture for Multi-level Cell Phase Change Memory System", IEEE/IFIP 41st International Conference on Dependable Systems & Networks 2011, pp. 197-208, Jun. 27-30, 2011.

U.S. Appl. No. 13/275,901, filed Oct. 18, 2011 by Xiaonan Chen (28 pp.).

U.S. Appl. No. 13/276,053, filed Oct. 18, 2011 by Alessandro Torsi (29 pp.).

* cited by examiner

PERFORMING FORMING PROCESSES ON RESISTIVE MEMORY

PRIORITY INFORMATION

This application is a continuation of U.S. application Ser. No. 13/286,375, filed Nov. 1, 2011, which is incorporated by reference.

TECHNICAL FIELD

The present disclosure relates generally to semiconductor memory apparatuses and methods, and more particularly, to performing forming processes on resistive memory.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), flash memory, and resistive (e.g., resistance variable) memory, among others. Types of resistive memory include programmable conductor memory, phase change random access memory (PCRAM), resistive random access memory (RRAM), magnetoresistive random access memory (MRAM; also referred to as magnetic random access memory), and conductive-bridging random access memory (CBRAM), among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), personal digital assistants (PDAs), digital cameras, cellular telephones, portable music players (e.g., MP3 players) and movie players, among other electronic devices. Data, such as program code, user data, and/or system data, such as a basic input/output system (BIOS), are typically stored in non-volatile memory devices.

Resistive memory such as RRAM includes resistive memory cells that can store data based on the resistance state of a storage element (e.g., a resistive memory element having a variable resistance). As such, resistive memory cells can be programmed to store data corresponding to a target data state by varying the resistance level of the resistive memory element. Resistive memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the resistive memory element of the cells) for a particular duration.

One of a number of data states (e.g., resistance states) can be set for a resistive memory cell. For example, a single level cell (SLC) may be programmed to one of two data states (e.g., logic 1 or 0), which can depend on whether the cell is programmed to a resistance above or below a particular level. As an additional example, various resistive memory cells can be programmed to one of multiple different resistance states corresponding to multiple data states. Such cells may be referred to as multi state cells, multi-digit cells, and/or multilevel cells (MLCs), and can represent multiple binary digits of data (e.g., 10, 01, 00, 11, 111, 101, 100, 1010, 1111, 0101, 0001, etc.).

In the case of various resistive memory cells, such as RRAM cells, a "forming" process can be performed to initiate the resistive switching property of the cell (e.g., of the resistive storage element of the cell). The forming process can be referred to as an electroforming process and can include formation of an initial conductive filament, which can serve as a switching element for the cell. Such a forming process can be performed on virgin cells (e.g., to initialize cells which have yet to experience set/reset operations) and/or on "tail bits" associated with formation free cells (e.g., resistive cells that may not require a forming process to initialize a bistable switching capability).

Various previous forming processes can have a number of drawbacks. For instance, various previous forming processes can include application of an electrical pulse having a duration and/or amplitude that can stress (e.g., electrically stress) the cell, which can decrease the ability to switch the data state (e.g., resistance level) of the cell during subsequent programming operations. Further, such previous forming approaches can lead to relatively small resistance switching windows (e.g., a relatively small difference between a high resistance state and a low resistance state), for example.

DETAILED DESCRIPTION

Figure 1:
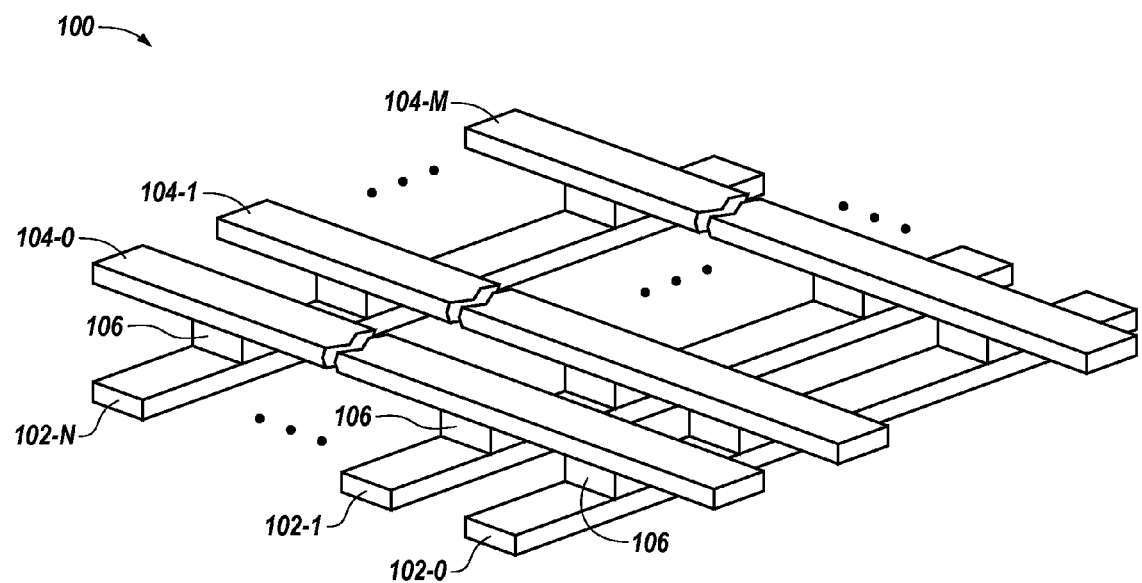
FIG. 1 is a block diagram of a portion of an array of resistive memory cells in accordance with one or more embodiments of the present disclosure.

The present disclosure includes apparatuses and methods for performing forming processes on resistive memory. A number of embodiments include applying a formation signal to the storage element of a resistive memory cell, wherein the formation signal includes a first portion having a first polarity and a first amplitude, a second portion having a second polarity and a second amplitude, wherein the second polarity is opposite the first polarity and the second amplitude is smaller than the first amplitude, and a third portion having the first polarity and a third amplitude that is smaller than the first amplitude.

Forming processes in accordance with a number of embodiments of the present disclosure can provide reduced electrical stress to a resistive memory cell, as compared with previous forming processes. For example, forming processes in accordance with a number of embodiments of the present disclosure may include use of electrical signals (e.g., pulses) having a shorter associated duration than electrical signals of previous forming processes. The reduced stress can increase the ability to switch the data state (e.g., resistance level) of the cell during subsequent programming operations, as compared with previous forming processes. Additionally, forming processes in accordance with a number of embodiments of the present disclosure can achieve a larger resistance switching window (e.g., a larger difference between a high resistance (reset) state and a low resistance (set) state) than that achieved by previous forming processes.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory cells can refer to one or more memory cells. Additionally, the designators "M" and "N" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 600 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 is a block diagram of a portion of an array 100 of resistive memory cells 106 in accordance with one or more embodiments of the present disclosure. In the example illustrated in FIG. 1, array 100 is a cross-point array having resistive memory cells 106 located at the intersections of a first number of conductive lines 102-0, 102-1, . . . , 102-N (e.g., access lines, which may be referred to herein as word lines), and a second number of conductive lines 104-0, 104-1, . . . , 104-M (e.g., data/sense lines, which may be referred to herein as bit lines). As illustrated in FIG. 1, word lines 102-0, 102-1, . . . , 102-N are substantially parallel to each other and are substantially orthogonal to bit lines 104-0, 104-1, . . . , 104-M, which are substantially parallel to each other; however, embodiments are not so limited. In the embodiment illustrated in FIG. 1, resistive memory cells 106 can function in a two-terminal architecture (e.g., with a particular word line 102-0, 102-1, . . . , 102-N and bit line 104-0, 104-1, . . . , 104-M serving as a bottom and top electrode for the cell).

Each resistive memory cell 106 can include a storage element (e.g., a resistive memory element) coupled (e.g., in series) to a select device (e.g., an access device). The access device can be, for example, a diode or a transistor (e.g., a field effect transistor (FET) or bipolar junction transistor (BJT)), among others. The storage element can include a programmable portion that may have a variable resistance, for example. For instance, the storage element can include one or more resistance variable materials (e.g., a material programmable to multiple different resistance states, which can represent multiple different data states) such as, for example, a transition metal oxide material or a perovskite including two or more metals (e.g., transition metals, alkaline earth metals, and/or rare earth metals). Other examples of resistance variable materials that can be included in the storage element of resistive memory cells 106 can include various materials employing trapped charges to modify or alter conductivity, chalcogenides formed of various doped or undoped materials, binary metal oxide materials, colossal magnetoresistive materials, and/or various polymer based resistive variable materials, among others. Embodiments are not limited to a particular resistance variable material or materials. As such, resistive memory cells 106 can be single level and/or multi-level resistive random access memory (RRAM) cells, programmable conductor memory cells, phase change random access memory (PCRAM) cells, magnetoresistive random access memory cells, and/or conductive-bridging random access memory (CBRAM) cells, among various other types of resistive memory cells.

In a number of embodiments, a forming process can be performed on the storage element of resistive memory cells 106 (e.g., to initiate the resistive switching property of the cell). The forming process can be referred to as an electroforming process, and can include formation of an initial conductive filament, which can serve as a switching mechanism for the cell (e.g., the filament can be used to switch the cell between a reset state and a set state). The filament can be formed of, for example, a number of metal precipitates and/or a number of oxygen vacancies. Forming processes in accordance with a number of embodiments of the present disclosure and filaments associated therewith will be further described herein.

In operation, resistive memory cells 106 of array 100 can be programmed via programming signals (e.g., write voltage and/or current pulses) applied to the cells (e.g., the storage element of the cells) via selected word lines 102-0, 102-1, . . . , 102-N and bit lines 104-0, 104-1, . . . , 104-M. The amplitude (e.g., magnitude), duration (e.g., width), and/or number of programming pulses, for example, applied to resistive memory cells 106 can be adjusted (e.g., varied) in order to program the cells to one of a number of different resistance states corresponding to particular data states.

A sensing (e.g., program verify and/or read) operation can be used to determine the data state of a resistive memory cell 106 (e.g., the resistance state of the storage element of a resistive memory cell 106) by a sensing (e.g., read) current, for example, on a bit line 104-0, 104-1, . . . , 104-M corresponding to the respective cell responsive to a particular voltage applied to the selected word line 102-0, 102-1, . . . , 102-N to which the selected cell is coupled.

Figure 2:
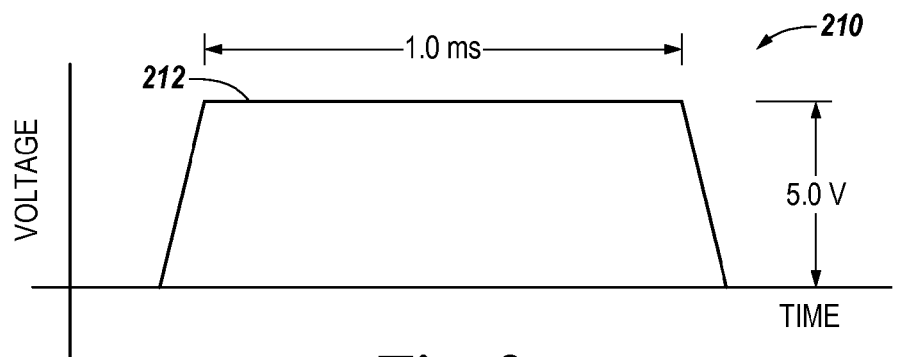
FIG. 2 illustrates a timing diagram associated with performing a forming process on resistive memory cells in accordance with a previous approach.

FIG. 2 illustrates a timing diagram including a signal 210 associated with performing a forming process on resistive memory cells (e.g., on the storage element of resistive memory cells) in accordance with a previous approach. Signal 210, which includes a single voltage pulse 212, can be used to perform a forming process on the storage element of resistive memory cells in accordance with a previous approach.

As an example, pulse 212 can be applied to a resistive memory cell (e.g., the storage element of the resistive memory cell) in association with a forming process in order to form a filament in the cell (e.g., in order to initiate the switching capability of the cell). Pulse 212 of signal 210 has a positive polarity (e.g., pulse 212 is a positive pulse), an amplitude of approximately 5.0 Volts (V), and a duration (e.g., width) of approximately 1.0 milliseconds (ms).

The long (e.g., 1.0 ms) duration of signal 210 can stress (e.g., electrically stress) the resistive memory cell, which can decrease the ability to switch the state (e.g., resistance level) of the cell during subsequent programming operations. Additionally, the stress to the cell can decrease the lifetime of the cell. For example, the stress on the cell can decrease the number of programming, erase, and/or sensing operations (e.g., cycles) that can be performed on the cell before the cell fails. Further, using a signal such as signal 210 in a formation process can lead to small resistance switching windows (e.g., a difference of less than 10× between a reset and set resistance state), as will be further described herein (e.g., in connection with FIGS. 5A and 5B). Moreover, since the forming process may include applying signal 210 to the storage element of each individual cell in an array, the duration of pulse 212 may lead to a longer than desirable formation time.

Figure 3:
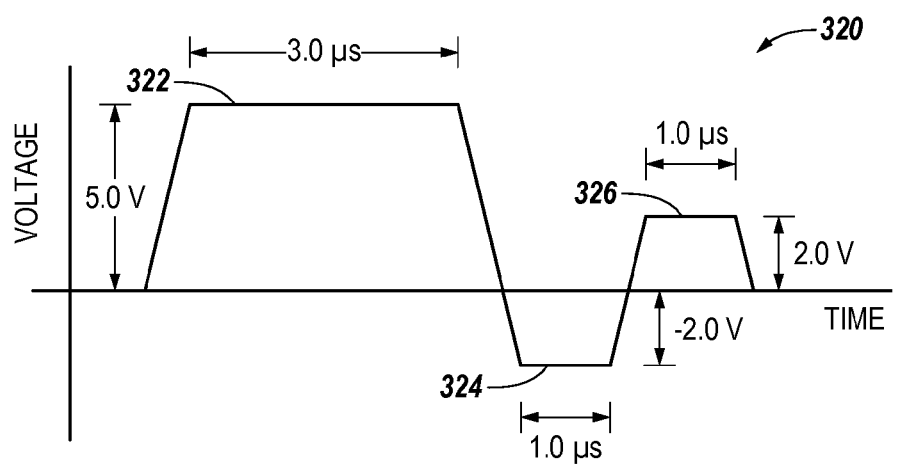
FIG. 3 illustrates a timing diagram associated with performing a forming process on resistive memory cells in accordance with one or more embodiments of the present disclosure.

FIG. 3 illustrates a timing diagram including a formation signal 320 associated with performing a forming process on resistive memory cells (e.g., on the storage element of resistive memory cells) in accordance with one or more embodiments of the present disclosure. Formation signal 320, which includes voltage pulses 322, 324, and 326, can be used to perform a tri-step forming process on the storage element of resistive memory cells such as resistive memory cells 106 of array 100 previously described in connection with FIG. 1.

As an example, pulses 322, 324, and 326 can be applied to a resistive memory cell (e.g., the storage element of the resistive memory cell) in association with a forming process in order to form a filament in the resistive memory cell (e.g., in order to initiate the switching capability of the cell). The resistive memory cell can be a virgin cell (e.g., a cell that has yet to experience any set and/or reset operations) when pulses 322, 324, and 326 are applied to the storage element. That is, formation signal 320 can be an initialization signal (e.g., the first signal and/or pulse applied to the storage element). However, embodiments of the present disclosure are not so limited. For example, in a number of embodiments, signal 320 can be applied to fix "tail bits" associated with formation free cells (e.g., cells that may not require a forming process to initiate a bistable switching capability).

Pulse 322 of formation signal 320 has a positive polarity (e.g., pulse 322 is a positive pulse), an amplitude of approximately 5.0 Volts (V), and a duration (e.g., width) of approximately 3.0 microseconds (μs). However, embodiments of the present disclosure are not limited to a particular amplitude or duration for pulse 322, which can be referred to as a set pulse 322. For example, the amplitude and duration of pulse 322 can depend on factors associated with the resistive memory cell material (e.g., the particular dielectric properties and/or oxide thickness of the resistive memory cell material), among other factors.

In a number of embodiments, a compliance current can be applied to the storage element of the resistive memory cell while pulse 322 is applied to the storage element in order to protect the integrity of the cell (e.g., to prevent damage to the cell material). The compliance current can be, for example, approximately 50 microamps (μA).

In the embodiment illustrated in FIG. 3, pulse 324, which can be referred to as a reset pulse 324, is applied to the storage element of the resistive memory cell immediately after pulse 322 is applied to the storage element. As shown in FIG. 3, the polarity of pulse 324 is opposite the polarity of pulse 322 (e.g., pulse 324 is a negative pulse). As an example, pulse 324 can have an amplitude of approximately −2.0 V and a duration of approximately 1.0 μs, as illustrated in FIG. 3. That is, pulse 324 can have a smaller amplitude and/or a shorter duration than pulse 322. However, embodiments of the present disclosure are not limited to a particular amplitude or duration for pulse 324. For example, the amplitude of pulse 324 can depend on factors associated with the resistive memory cell material (e.g., the particular dielectric properties and/or oxide thickness of the resistive memory cell material), and the duration of pulse 324 can depend on factors such as the switching characteristics of the cell (e.g., the behavior of the cell while switching between a reset and set resistance state), among other factors.

In the embodiment illustrated in FIG. 3, pulse 326, which can be referred to as a set pulse 326, is applied to the storage element of the resistive memory cell immediately after pulse 324 is applied to the storage element. As such, pulses 322, 324, and 326 can be applied to the storage element as a combined pulse.

As shown in FIG. 3, the polarity of the third pulse (e.g., pulse 326) is the same as the polarity of the first pulse (e.g., pulse 322) and opposite the polarity of the second pulse (e.g., pulse 324). That is, pulse 326 is a positive pulse. As an example, pulse 326 can have an amplitude of approximately 2.0 V and a duration of approximately 1.0 μs, as illustrated in FIG. 3. That is, pulse 326 can have a smaller amplitude and/or a shorter duration than pulse 322, and/or pulse 326 can have an amplitude and/or duration equal to pulse 324. However, embodiments of the present disclosure are not limited to a particular amplitude or duration for pulse 326. For example, the amplitude of pulse 326 can depend on factors associated with the resistive memory cell material (e.g., the particular dielectric properties and/or oxide thickness of the resistive memory cell material), and the duration of pulse 326 can depend on factors such as the switching characteristics of the cell, among other factors.

In a number of embodiments, a compliance current can be applied to the storage element of the resistive memory cell while pulse 326 is applied to the storage element in order to protect the integrity of the cell (e.g., to prevent damage to the cell material). The compliance current can be, for example, approximately 50 μA.

In the embodiment illustrated in FIG. 3, formation signal 320 has a duration of approximately 5.0 μs. However, embodiments of the present disclosure are not so limited. For example, in a number of embodiments, formation signal 320 can have a duration of approximately 3.0 to 5.0 μs.

As such, formation signal 320 can have a shorter duration than formation signals associated with previous forming processes such as signal 210 previously discussed in connection with FIG. 2. Accordingly, formation signal 320 can place less electrical stress on a cell than previous forming signals, which can increase the ability to switch the data state (e.g., resistance level) of the cell during subsequent programming operations performed on the cell, as compared with previous approaches. Additionally, placing less stress on the cell can increase the lifetime of the cell, as compared with previous approaches. For example, placing less stress on the cell can increase the number of programming, erase, and/or sensing operations (e.g., cycles) that can be performed on the cell before the cell fails, as compared with previous approaches. Further, using a signal such as formation signal 320 in a formation process can achieve a larger resistance switching window (e.g., a difference of greater than 10× between a reset and set resistance state) than previous approaches (e.g., approaches using signal 210), as will be further described herein (e.g., in connection with FIGS. 5A and 5B). Additionally, the shorter duration of signal 320 as compared to signal 210 can reduce the time needed to complete a forming process on an array of resistive memory cells.

In a number of embodiments, the application of formation signal 320 to the storage element of a resistive memory cell in association with a forming process is effective in initiating the switching property of the cell. As such, a number of subsequent programming signals (e.g., set and/or reset pulses) can be applied to the resistive memory cell to switch the cell between a high resistance reset state and a low resistance set state. In multilevel operation, the cells can be programmed to a number of resistance levels corresponding to data states between the set state and reset state.

Although voltage pulses are shown in FIG. 3, embodiments of the present disclosure are not so limited. For example, formation signal 320 could include current pulses.

Figure 4A:
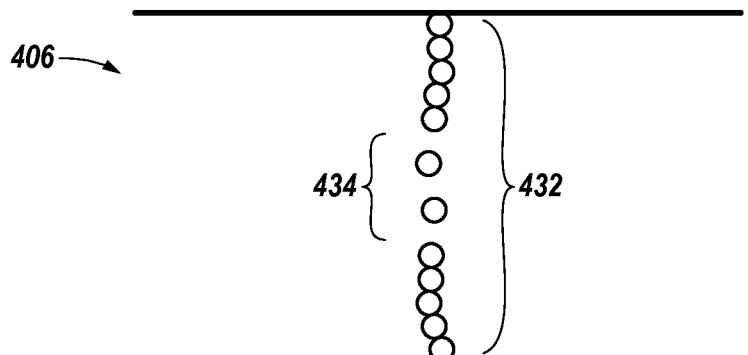
FIGS. 4A-4C illustrate the formation of a filament within a resistive memory cell in association with a forming process in accordance with one or more embodiments of the present disclosure.
Figure 4B:
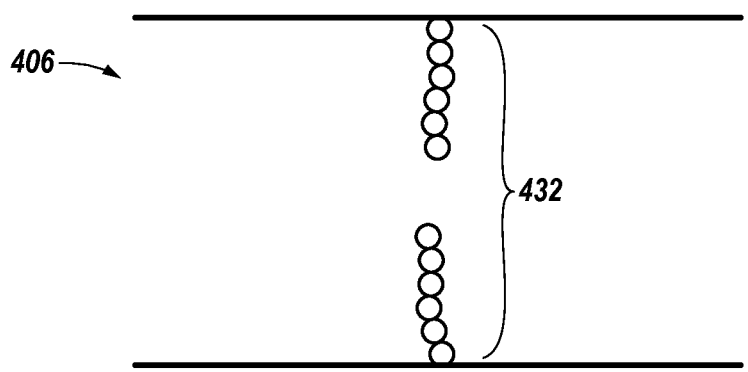
Figure 4C:
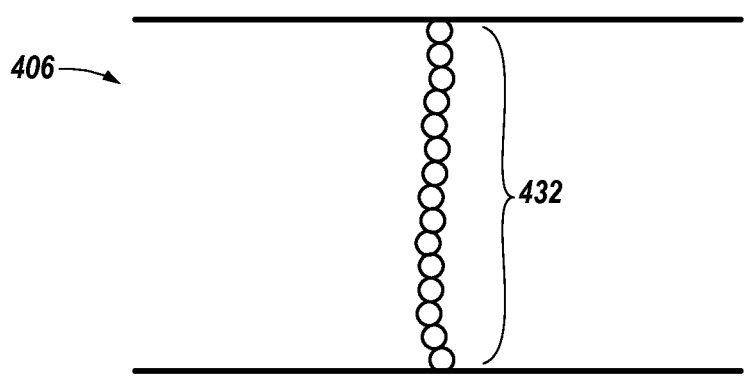

FIGS. 4A-4C illustrate the formation of a filament 432 within a resistive memory cell 406 in association with a forming process in accordance with one or more embodiments of the present disclosure. Resistive memory cell 406 can be, for example, a cell such as resistive memory cells 106 of array 100 previously described in connection with FIG. 1.

In a number of embodiments, filament 432 can be formed by applying a formation signal such as formation signal 320 shown in FIG. 3 to the storage element of resistive memory cell 406 (e.g., in association with a forming process). For example, in the embodiment illustrated in FIGS. 4A-4C, FIG. 4A corresponds to pulse 322 (e.g., FIG. 4A illustrates filament 432 after pulse 322 is applied to the storage element), FIG. 4B corresponds to pulse 324 (e.g., FIG. 4B illustrates filament 432 after pulse 324 is applied to the storage element), and FIG. 4C corresponds to pulse 326 (e.g., FIG. 4C illustrates filament 432 after pulse 326 is applied to the storage element).

As shown in FIG. 4A, applying a first pulse having a first polarity (e.g., pulse 322) to the storage element of resistive memory cell 406 can induce formation of an initial filament 432. The initial filament 432 can be an incomplete (e.g., not fully formed) filament that includes a resistive portion 434, as illustrated in FIG. 4A. That is, applying a first pulse of a formation signal (e.g., pulse 322 of signal 320) to the storage element may form only a portion of filament 432.

As shown in FIG. 4B, applying a second pulse having a polarity opposite of the polarity of the first pulse (e.g., pulse 324) to the storage element of resistive memory cell 406 can rupture resistive portion 434 of the initial filament 432. That is, applying a second pulse of a formation signal (e.g., pulse 324 of signal 320) to the storage element may form a gap (e.g., space) in filament 432 where resistive portion 434 was previously located, as illustrated in FIG. 4B.

As shown in FIG. 4C, applying a third pulse having the same polarity as the first pulse (e.g., pulse 326) to the storage element of resistive memory cell 406 can form a complete (e.g., fully formed) filament 432. That is, applying a third pulse of a formation signal (e.g., pulse 326 of signal 320) to the storage element may complete (e.g., fill) the gap in filament 432 where resistive portion 434 was previously located, as illustrated in FIG. 4C.

Figure 5A:
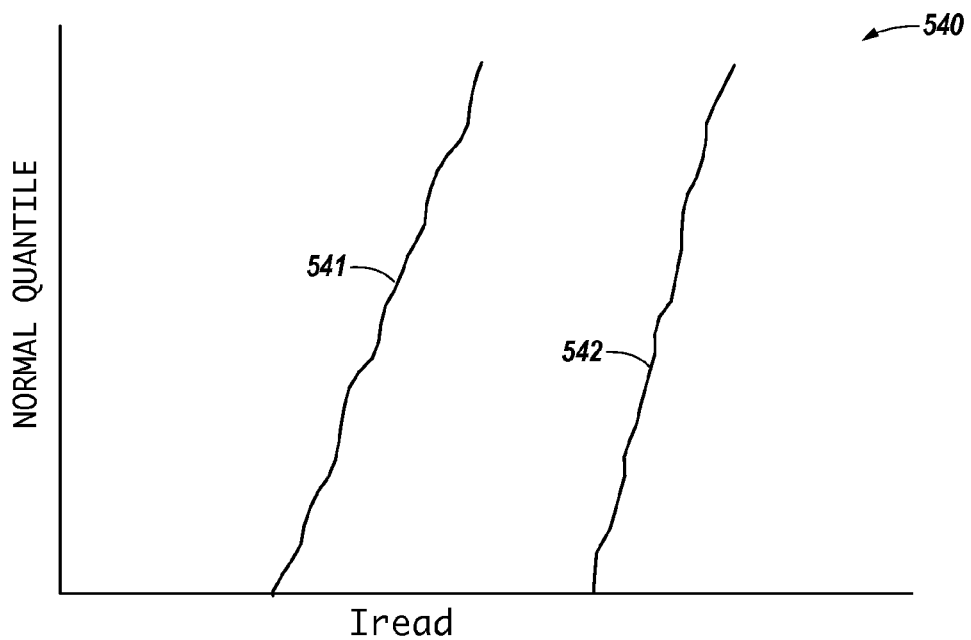
FIG. 5A is a graph illustrating read currents associated with resistive memory cells having undergone a forming process in accordance with a previous approach.
Figure 5B:
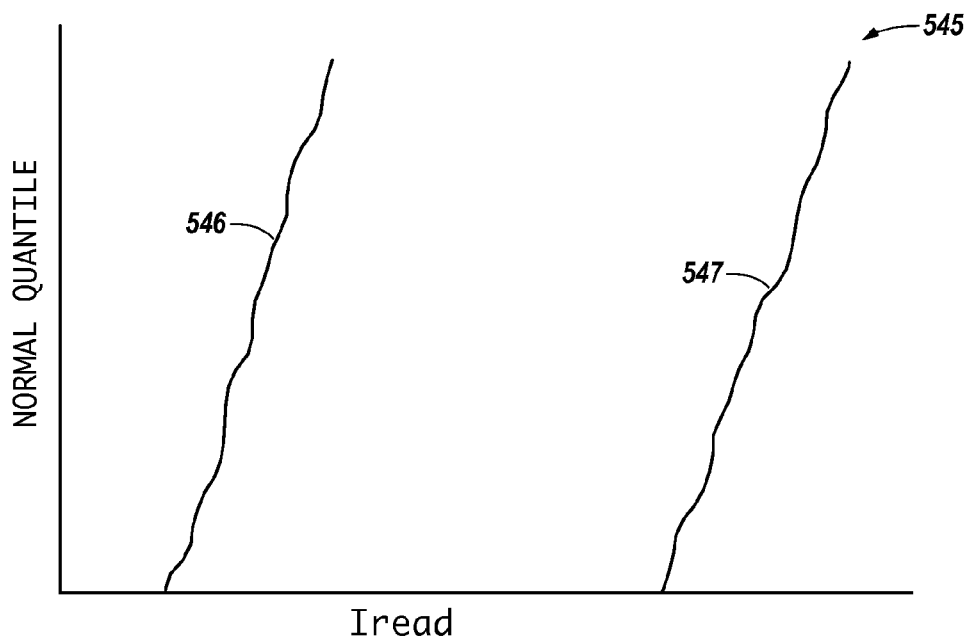
FIG. 5B is a graph illustrating read currents associated with resistive memory cells having undergone a forming process in accordance with one or more embodiments of the present disclosure.

FIG. 5A is a graph 540 illustrating read currents 541 and 542 associated with resistive memory cells having undergone a forming process in accordance with a previous approach (e.g., a forming process that includes application of a signal such as signal 210 previously described in connection with FIG. 2). FIG. 5B is a graph 545 illustrating read currents 546 and 547 associated with resistive memory cells having undergone a forming process in accordance with one or more embodiments of the present disclosure (e.g., a forming process that includes application of a formation signal such as formation signal 320 previously described in connection with FIG. 3).

In the examples shown in FIGS. 5A and 5B, the resistive memory cells have been programmed to one of two different states (e.g., a high resistance (reset) state and a low resistance (set) state). For example, read currents 541 and 546 can correspond to a reset state, and read currents 542 and 547 can correspond to a set state.

As shown in FIGS. 5A and 5B, the separation (e.g., difference) between read currents 546 and 547 is greater than the separation between read currents 541 and 542. As such, the greater separation associated with read currents 546 and 547 of graph 545 indicates a larger resistance switching window associated with cells corresponding to graph 545 as compared to that associated with cells corresponding to graph 540. Accordingly, FIGS. 5A and 5B illustrate that forming processes in accordance with one or more embodiments of the present disclosure can achieve larger resistance switching windows than previous forming processes.

As a result of the larger resistance switching windows, resistive memory cells having undergone a forming process in accordance with one or more embodiments of the present disclosure can be programmed with greater efficiency than resistive memory cells having undergone a previous forming process. For example, resistive memory cells having undergone a forming process in accordance with one or more embodiments of the present disclosure can switch between a reset state and a set state more efficiently than resistive memory cells having undergone a previous forming process. For instance, more cells in an array of resistive memory cells having undergone a forming process in accordance with one or more embodiments of the present disclosure (e.g., array 100 previously described in connection with FIG. 1) may be able to switch between a reset and set state than in an array of resistive memory cells having undergone a previous forming process.

Figure 6:
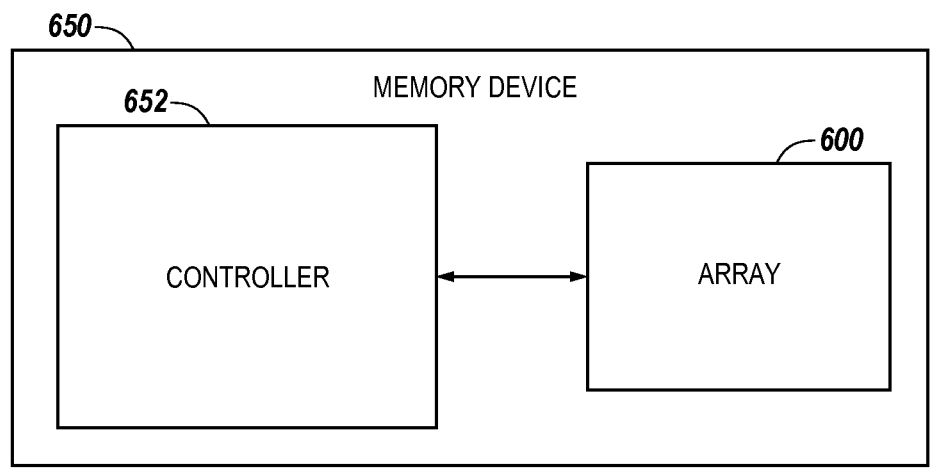
FIG. 6 illustrates a block diagram of an apparatus in the form of a memory device in accordance with one or more embodiments of the present disclosure.

FIG. 6 illustrates a block diagram of an apparatus in the form of a memory device 650 in accordance with one or more embodiments of the present disclosure. As shown in FIG. 6, memory device 650 includes a controller 652 coupled to a memory array 600.

Memory array 600 can be, for example, memory array 100 previously described in connection with FIG. 1. Although one memory array is shown in FIG. 6, embodiments of the present disclosure are not so limited (e.g., memory device 650 can include more than one memory array coupled to controller 652).

Controller 652 can include, for example, control circuitry and/or firmware. Controller 652 can be included on the same physical device (e.g., the same die) as memory array 600, or can be included on a separate physical device that is communicatively coupled to the physical device that includes memory array 600. For example, controller 652 can be a controller of an array testing apparatus (e.g., a controller used to perform testing operations on memory arrays such as array 600).

Controller 652 can apply a number of signals in accordance with a number of embodiments of the present disclosure to the memory cells (e.g., to the storage elements of the memory cells) in memory array 600. For example, controller 652 can apply a formation signal such as formation signal 320 (e.g., pulses 322, 324, and 326) previously described in connection with FIG. 3 to the storage element of the memory cells in memory array 600.

The embodiment illustrated in FIG. 6 can include additional circuitry that is not illustrated so as not to obscure embodiments of the present disclosure. For example, memory device 650 can include address circuitry to latch address signals provided over I/O connectors through I/O circuitry. Address signals can be received and decoded by a row decoder and a column decoder, to access memory array 600. As an additional example, memory device 650 can include sense (e.g., read) circuitry.

CONCLUSION

The present disclosure includes apparatuses and methods for performing forming processes on resistive memory. A number of embodiments include applying a formation signal to the storage element of a resistive memory cell, wherein the formation signal includes a first portion having a first polarity and a first amplitude, a second portion having a second polarity and a second amplitude, wherein the second polarity is opposite the first polarity and the second amplitude is smaller than the first amplitude, and a third portion having the first polarity and a third amplitude that is smaller than the first amplitude.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of performing a forming process on a storage element of a resistive memory cell, the method comprising:
   rupturing a resistive portion of an initial filament by applying a pulse to the storage element; and
   forming a complete filament by applying an additional pulse to the storage element.

2. The method of claim 1, wherein the pulse and the additional pulse have opposite polarities.

3. The method of claim 1, wherein the pulse and the additional pulse have substantially equal amplitudes.

4. The method of claim 1, wherein the pulse and the additional pulse have substantially equal durations.

5. The method of claim 1, wherein the method includes applying the pulse to the storage element before applying the additional pulse to the storage element.

6. The method of claim 1, wherein the initial filament is an incomplete filament.

7. A method of performing a forming process on a storage element of a resistive memory cell, the method comprising:
   applying a formation signal to the storage element, wherein:
   a portion of the formation signal causes rupturing of a resistive portion of an initial filament; and
   an additional portion of the formation signal causes formation of a complete filament.

8. The method of claim 7, wherein another additional portion of the formation signal induces formation of the initial filament.

9. The method of claim 8, wherein the another additional portion has a duration that is longer than a duration of the portion and a duration of the additional portion.

10. The method of claim 8, wherein the another additional portion is applied to the storage element before the portion and the additional portion are applied to the storage element.

11. The method of claim 8, wherein:
    a polarity of the portion is negative; and
    a polarity of the additional portion and the another additional portion is positive.

12. An apparatus, comprising:
    an array of resistive memory cells; and
    a controller configured to apply a formation signal to a storage element of a number of the resistive memory cells, wherein the formation signal includes:
    a portion configured to rupture a resistive portion of an initial filament; and
    an additional portion configured to form a complete filament.

13. The apparatus of claim 12, wherein the formation signal is an initialization signal.

14. The apparatus of claim 12, wherein the controller is configured to apply a compliance current to the storage element while the additional portion is applied to the storage element.

15. The apparatus of claim 12, wherein the controller is configured to apply a programming signal to the number of resistive memory cells after applying the formation signal to the storage element.

16. The apparatus of claim 12, wherein:
    the portion is configured to form a gap in the initial filament; and
    the additional portion is configured to complete the gap.

17. A method of performing a forming process on a storage element of a resistive memory cell, the method comprising:
    applying a pulse to the storage element; and
    applying an additional pulse to the storage element;
    wherein the pulse and the additional pulse have opposite polarities and substantially equal amplitudes.

18. The method of claim 17, wherein applying the pulse to the storage element causes rupturing of a resistive portion of an initial filament.

19. The method of claim 17, wherein applying the additional pulse to the storage element causes formation of a complete filament.

20. The method of claim 17, wherein the pulse is a reset pulse.

21. The method of claim 17, wherein the additional pulse is a set pulse.

22. The method of claim 17, wherein the method includes applying the pulse and the additional pulse to the storage element as a combined pulse.

23. An apparatus, comprising:
an array of resistive memory cells; and
a controller configured to apply a formation signal to a storage element of a number of the resistive memory cells, wherein the formation signal includes:
a portion; and
an additional portion;
wherein the portion and the additional portion have opposite polarities and substantially equal amplitudes.

24. The apparatus of claim 23, wherein the formation signal includes another additional portion having a polarity opposite the polarity of the portion and the same as the polarity of the additional portion.

25. The apparatus of claim 23, wherein the formation signal includes another additional portion having an amplitude larger than the amplitudes of the portion and the additional portion.

26. The apparatus of claim 23, wherein the polarity of the portion is negative and the polarity of the additional portion is positive.

27. The apparatus of claim 23, wherein the number of resistive memory cells are virgin resistive memory cells.

* * * * *